United States Patent
Feustel et al.

(10) Patent No.: US 8,039,398 B2
(45) Date of Patent: Oct. 18, 2011

(54) METHOD OF REDUCING NON-UNIFORMITIES DURING CHEMICAL MECHANICAL POLISHING OF EXCESS METAL IN A METALLIZATION LEVEL OF MICROSTRUCTURE DEVICES

(75) Inventors: Frank Feustel, Dresden (DE); Robert Seidel, Dresden (DE); Juergen Boemmels, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1040 days.

(21) Appl. No.: 11/866,701

(22) Filed: Oct. 3, 2007

(65) Prior Publication Data

US 2008/0206994 A1 Aug. 28, 2008

(30) Foreign Application Priority Data

Feb. 28, 2007 (DE) .................. 10 2007 009 902

(51) Int. Cl.
*H01L 21/302* (2006.01)
(52) U.S. Cl. .......... 438/693; 257/E21.214; 257/E21.304
(58) Field of Classification Search .................. None
See application file for complete search history.

(56) References Cited

U.S. PATENT DOCUMENTS

| | | | | |
|---|---|---|---|---|
| 5,395,801 A * | 3/1995 | Doan et al. | | 438/692 |
| 5,721,172 A * | 2/1998 | Jang et al. | | 438/424 |
| 5,827,782 A * | 10/1998 | Shih | | 438/697 |
| 5,840,629 A | 11/1998 | Carpio | | 438/692 |
| 5,847,461 A * | 12/1998 | Xu et al. | | 257/751 |
| 5,920,792 A * | 7/1999 | Lin | | 438/633 |
| 6,004,873 A * | 12/1999 | Jang et al. | | 438/618 |
| 6,051,496 A | 4/2000 | Jang | | 438/687 |
| 6,096,652 A * | 8/2000 | Watts et al. | | 438/692 |
| 6,114,234 A | 9/2000 | Merchant et al. | | 438/631 |
| 6,114,246 A * | 9/2000 | Weling | | 438/691 |
| 6,169,028 B1 * | 1/2001 | Wang et al. | | 438/653 |
| 6,242,805 B1 * | 6/2001 | Weling | | 257/752 |
| 6,258,711 B1 | 7/2001 | Laursen | | 438/633 |
| 6,287,970 B1 | 9/2001 | Merchant et al. | | 438/687 |
| 6,291,367 B1 * | 9/2001 | Kelkar | | 438/778 |
| 6,300,653 B1 * | 10/2001 | Pan | | 257/296 |

(Continued)

FOREIGN PATENT DOCUMENTS

WO    WO 01/21724 A1    3/2001

OTHER PUBLICATIONS

Translation of Official Communication from German Patent Office for German Patent Application No. 10 2007 009 902.0-43 dated Oct. 16, 2007.

*Primary Examiner* — Allan Olsen
(74) *Attorney, Agent, or Firm* — Williams, Morgan & Amerson, P.C.

(57) ABSTRACT

Prior to performing a CMP process for planarizing a metallization level of an advanced semiconductor device, an appropriate cap layer may be formed in order to delay the exposure of metal areas of reduced height level to the highly chemically reactive slurry material. Consequently, metal of increased height level may be polished with a high removal rate due to the mechanical and the chemical action of the slurry material, while the chemical interaction with the slurry material may be substantially avoided in areas of reduced height level. Therefore, a high process uniformity may be achieved even for pronounced initial surface topographies and slurry materials having a component of high chemical reactivity.

22 Claims, 4 Drawing Sheets

U.S. PATENT DOCUMENTS

| | | | |
|---|---|---|---|
| 6,391,707 B1 * | 5/2002 | Dirnecker et al. | 438/250 |
| 6,391,780 B1 | 5/2002 | Shih et al. | 438/692 |
| 6,646,323 B2 * | 11/2003 | Dirnecker et al. | 257/532 |
| 7,605,082 B1 * | 10/2009 | Reid et al. | 438/678 |
| 7,811,925 B1 * | 10/2010 | Reid et al. | 438/622 |
| 2002/0096770 A1 | 7/2002 | Mukherjee et al. | 257/758 |
| 2002/0163029 A1 * | 11/2002 | Dirnecker et al. | 257/306 |
| 2002/0182886 A1 | 12/2002 | Spinner, III et al. | 438/763 |
| 2003/0054649 A1 * | 3/2003 | Wu et al. | 438/692 |
| 2003/0203624 A1 * | 10/2003 | Sameshima et al. | 438/687 |
| 2004/0266188 A1 | 12/2004 | Kondo et al. | 438/689 |
| 2006/0003570 A1 * | 1/2006 | Shanmugasundram et al. | 438/618 |
| 2006/0042502 A1 | 3/2006 | Sato et al. | 106/10 |
| 2006/0054962 A1 * | 3/2006 | Dunton et al. | 257/313 |
| 2006/0163083 A1 * | 7/2006 | Andricacos et al. | 205/674 |
| 2009/0045164 A1 * | 2/2009 | Farkas et al. | 216/38 |
| 2010/0051474 A1 * | 3/2010 | Andricacos et al. | 205/662 |
| 2010/0093168 A1 * | 4/2010 | Naik | 438/618 |

* cited by examiner

METHOD OF REDUCING NON-UNIFORMITIES DURING CHEMICAL MECHANICAL POLISHING OF EXCESS METAL IN A METALLIZATION LEVEL OF MICROSTRUCTURE DEVICES

BACKGROUND OF THE INVENTION

1. Field of the Invention

The present disclosure generally relates to the field of fabricating integrated circuits, and, more particularly, to the planarization of a metallization layer and/or the removal of excess metal from a dielectric layer.

2. Description of the Related Art

In manufacturing microstructures, such as integrated circuits, various material layers are deposited on a substrate and are patterned by lithography, such as photolithography, etch processes and the like to provide a large number of individual features such as circuit elements in the form of transistors, capacitors, resistors, interconnect structures and the like. Due to the continuous reduction of feature sizes of the individual structure elements, sophisticated lithography and etch techniques have been developed that allow the resolution of critical dimensions, i.e., of minimum feature sizes, well beyond the wavelength of the radiation used for transferring images from a reticle to a mask layer that is used in subsequent etching processes. Since these sophisticated imaging techniques are quite sensitive to any underlying material layers and to the surface topography, it is frequently necessary to planarize the respective device levels formed above the substrate to provide a substantially planar surface for the application of further material layers to be patterned. This is especially true for so-called metallization layers required in integrated circuits or other microstructure devices comprising a plurality of electric elements to electrically connect the individual circuit elements. Depending on the feature sizes of the circuit elements and the number thereof, a plurality of metallization layers, stacked on top of each other and electrically connected by so-called vias, are typically required for providing the complex functionality of modern integrated circuits.

It has therefore become standard practice in forming stacked metallization layers to planarize the current device level of the substrate prior to forming a subsequent metallization layer. Chemical mechanical polishing (CMP) has proven to be a viable process technique for this purpose. In chemically mechanically polishing a substrate surface, in addition to the mechanical removal of the material, a slurry is supplied, typically containing one or more chemical reagents that react with the material or materials on the surface, wherein the reaction products may then be more efficiently removed by the mechanical polishing process. In addition to the appropriate selection of the slurry composition, the relative motion between the substrate and a polishing pad, as well as the force with which the substrate is pressed against the polishing pad, are controlled to obtain the desired removal rate.

Recently, chemical mechanical polishing has increasingly gained in importance as aluminum is continuously replaced with copper and other metals or metal alloys of enhanced conductivity in high-end integrated circuits exhibiting feature sizes in the deep sub-micron regime. Although copper and alloys thereof exhibit superior characteristics compared to aluminum in terms of conductivity and resistance against electromigration, many problems are involved in processing copper-based materials in a semiconductor facility, one of which resides in the fact that copper may not be very efficiently deposited in large amounts with well-established deposition techniques, such as chemical vapor deposition and sputter deposition. Moreover, copper may not be efficiently patterned by conventional anisotropic etch techniques. Therefore, instead of applying copper or copper alloys as a blanket layer and patterning metal lines, the so-called damascene or in-laid approach has become a standard process technique in forming metallization layers comprised of copper.

In the damascene technique, trenches and vias are formed in a dielectric layer and the metal is subsequently filled into the trenches and vias, wherein a certain amount of over-filling has to be provided to reliably fill the trenches and vias. Prior to depositing the metal, usually by performing a plating process, such as electroplating or electroless plating, a barrier layer is formed in the trench to minimize out-diffusion of copper or other highly diffusive metal compounds into the adjacent dielectric. Thereafter, a thin seed layer for electroplating strategies or any other activation material is usually applied using appropriate deposition techniques, such as sputter deposition, chemical vapor deposition (CVD), atomic layer deposition (ALD), electroless deposition and the like, to promote the subsequent plating process of the bulk metal material. After the deposition of the metal, the excess metal, including the thin barrier layer and the seed layer, has to be reliably removed in order to obtain metal trenches and vias that are electrically insulated from each other. The excess material is frequently removed by a process sequence including chemical mechanical polishing. The respective wet chemical deposition process may require sophisticated recipes in order to reliably fill trenches and vias of different aspect ratios in a substantially void-free manner. Moreover, the deposition behavior may depend on the local pattern geometry, that is, densely packed areas may result in a different local deposition rate in areas outside the trenches and vias compared to areas having isolated metal regions. Thus, after the wet chemical deposition process, a pronounced surface topography may be encountered. Due to the complex surface topography and the plurality of different materials that my be present at the same time, at least during a final phase of the polishing process, a sophisticated operation mode may be required for removing the essential amount of the metal in a first polishing period and removing metal, barrier material and to a certain amount the dielectric during a subsequent phase of the polishing process. The polishing process may therefore be carried out in several steps or operation modes, wherein the uniformity of each phase may have a significant influence on the overall process uniformity. Thus, different chemistries in the slurries as well as different parameter settings for the speed of the relative motion and/or the down force applied to the substrate during these different polishing phases may be required. In sophisticated process regimes, the slurries used may have a highly efficient chemical component in order to obtain the desired high removal rate based on the chemical reaction, while abrasives are also added to the slurry to adjust the mechanical removal rate. In the final phase, the removal is more complex as usually two or more materials have to be polished at the same time, i.e., the metal, the barrier material and the dielectric. Moreover, a certain amount of "overpolish" has to be applied in an attempt to remove substantially all of the conductive material on surface portions of the dielectric material to minimize leakage currents or shorts between adjacent metal lines. Completely removing the conductive material from a substrate having a diameter of 200 mm or 300 mm is, however, a challenging task and usually leads to a certain amount of dishing and erosion of the metallization structures, as will be explained with reference to FIGS. 1a and 1b.

Figure 1A:
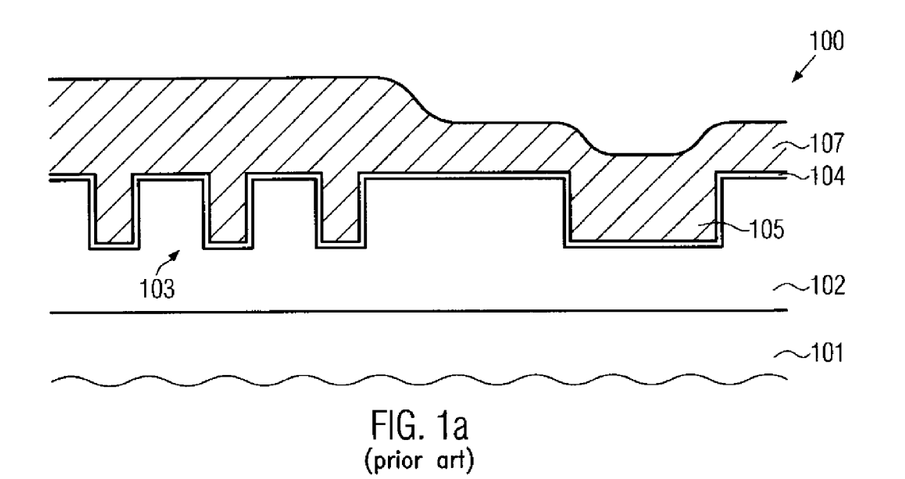
FIGS. 1a-1b schematically illustrate cross-sectional views of a metallization structure of a semiconductor device during various manufacturing stages in removing excess copper material on the basis of a CMP process, resulting in increased material erosion due to the initially pronounced surface topography of the copper material.

FIG. 1a schematically shows a cross-sectional view of a semiconductor structure 100 including a substrate 101 with a dielectric layer 102 formed above the substrate 101. The substrate 101 may include circuit elements, such as transistors, resistors and the like, which are for convenience not shown in FIG. 1a. The dielectric layer 102 may be comprised of any appropriate material, such as silicon dioxide, silicon nitride, low-k dielectric materials, which are to be understood as dielectrics having a dielectric constant that is approximately 3.0 and less. Trenches 103 having a lateral dimension and a spacing in accordance with device requirements may represent a device area including densely spaced metal lines. For example, the lateral dimensions of the trenches 103 may range from several hundred nanometers to a hundred nanometers and less in sophisticated semiconductor devices. The dielectric layer 102 may further comprise a wide trench 105, which may be provided with increased distance to the densely packed area represented by the trenches 103. The trenches 103 and 105 may be filled with a highly conductive metal 107, such as copper, wherein a respective barrier layer 104 may separate the copper 107 from the dielectric material of the layer 102. The copper layer 107 is formed over the structure 100 with a thickness that reliably fills the trenches 105 and 103, thereby also creating a pronounced surface topography, which may result in an increased excess thickness above the trenches 103 and a minimal excess thickness above the wide trench 105.

The semiconductor structure 100 as shown in FIG. 1a may be formed in accordance with well-known patterning and deposition techniques as already briefly described above. That is, after forming any circuit elements, the dielectric layer 102 may be formed on the basis of well-established techniques, followed by a patterning sequence for forming the trenches 103 and 105. Subsequently, the barrier layer 104 and a seed layer (not shown) may be formed. Next, the copper layer 107 is formed by an electrochemical deposition process, in which usually complex deposition chemistries and current pulse schemes are applied in order to fill the trenches 103 and 105. The local deposition rate may significantly depend on the local pattern density, i.e., the number of metal lines per unit area, the dimension of the openings to be filled and the respective deposition recipe. Hence, significant local height variations of the layer 107 may occur, which may significantly affect a chemical mechanical polishing (CMP) process designed to remove the excess material of the layer 107 and also remove the barrier material of the layer 104 so as to obtain electrically insulated metal lines. During the CMP process, the slurry and the mechanical parameters, such as down force, relative speed between the substrate 101 and a polishing pad and the like, may substantially determine the removal rate and the process uniformity. In sophisticated applications, the removal rate may be enhanced by using a slurry with highly reactive chemical components, while the pronounced surface topography resulting from the deposition of the layer 107 may generate respective height non-uniformities during the CMP process due to the enhanced chemical component of the CMP process.

Figure 1B:
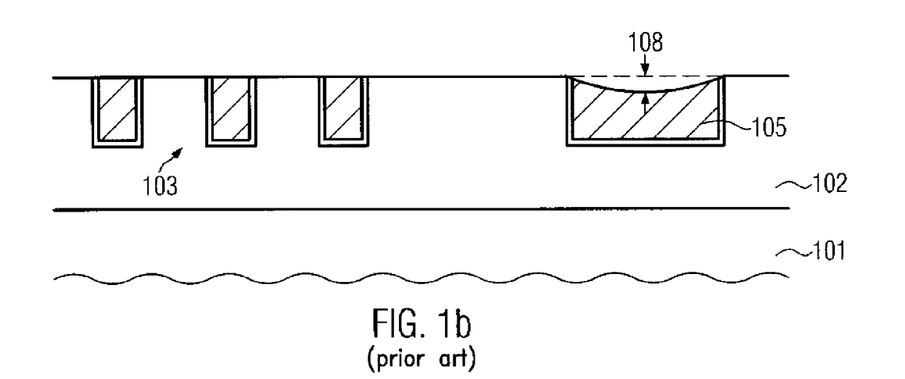

FIG. 1b schematically shows the semiconductor structure 100 after completion of the CMP process. The conductive materials of the layers 107 and 104 are substantially removed from the surface of the dielectric layer 102. Since respective overpolish times may be required to completely remove any conductive residues between the densely spaced trenches 103 and, due to the enhanced chemical component in the polishing process, a significant degree of dishing 108 may occur, thereby possibly rendering the trench 105 unreliable due to the reduced cross-sectional area that may lead to increased current densities during operation. A reduction of the chemical efficiency of the slurry in favor of an increased mechanical removal component may, however, be less desirable due to a significant reduction of the overall removal rate.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to an enhanced technique for planarizing metallization levels of sophisticated microstructure devices having a pronounced surface topography on the basis of a process sequence including a chemical mechanical polishing (CMP) process. The CMP process may be performed on the basis of a slurry component including a highly efficient chemical agent so as to provide a high removal rate, wherein enhanced process uniformity may be obtained by selectively reducing the effect of the chemically reactive slurry at material portions having a reduced height level. Consequently, during the CMP process, exposed metal-containing portions may react with the chemically efficient slurry material, thereby maintaining a high removal rate at these device regions, while the areas of reduced height level may experience a significantly reduced removal rate. Thus, the pronounced surface topography may be equalized in an efficiently more dynamic manner compared to conventional strategies, thereby also significantly reducing any non-uniformities at the final phase of the CMP process. Thus, increased material erosion above metal lines located at areas having an initially reduced height level may be reduced, thereby contributing to enhanced performance and reliability of the respective metallization structure.

According to one illustrative embodiment, a method comprises forming a metal layer above a patterned dielectric layer formed above a substrate. The method further comprises forming a cap layer on the metal layer and removing the cap layer and excess material of the metal layer by chemical mechanical polishing.

According to another illustrative embodiment, a method of planarizing a metal-containing layer of a semiconductor device is disclosed. The method comprises selectively exposing metal material of a first portion of the metal-containing layer to a slurry during a chemical mechanical polishing process while covering a second portion of the metal-containing layer. The first portion has a first height level that is lower than a second height level of a second portion of the metal-containing layer.

According to a further illustrative embodiment, a method comprises forming a metal-containing material above a dielectric layer of a semiconductor device, wherein the dielectric layer comprises a plurality of openings filled by the metal-containing material. The metal-containing material comprises a first portion of excess material having a first height level and comprises a second portion of excess material having a second height level that is lower than the first height level. The method further comprises forming a cap layer at least on the second portion of the metal-containing material and removing the first and the second portions by a process including a chemical mechanical polishing process.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to enhanced planarization techniques used in forming metallization levels of advanced microstructure devices, such as integrated circuits including one or more metallization layers formed on the basis of highly conductive metal materials, such as copper, copper alloys and the like. As previously explained, in advanced metallization layers, highly conductive materials, such as copper, copper alloys, silver and the like, may be deposited on the basis of in-laid techniques, thereby requiring highly advanced electrochemical deposition techniques which may result in pronounced surface topography, as previously explained. When removing the excess material to provide electrically insulated metal lines and metal regions, chemically highly reactive slurry mixtures may be used during the CMP process to achieve a high removal rate in view of enhanced throughput of the overall process flow and also to reduce mechanical stress in the metallization level during the mechanical interaction of the polishing pad and the surface to be treated, since typically low-k dielectric materials may be used in combination with highly conductive metals in order to reduce parasitic capacitances. Consequently, the increased chemical activity of the slurry material may also act on device portions of reduced height level and therefore cause a significant material removal even without intensive mechanical interaction with the corresponding polishing pad. Hence, the pronounced differences in height level in the metal layer may be equalized in a less efficient manner, thereby introducing significant non-uniformities during a final phase of the CMP process which may therefore lead to a significant erosion of metal regions located in areas of initially reduced height levels.

In embodiments disclosed herein, the deleterious effects of the chemically reactive slurry material may be locally reduced or compensated for by providing a cap layer to significantly delay the exposure of metal material located at areas of low height level. Consequently, the metal at areas with increased height level may be efficiently removed by the chemical effect of the slurry material and the mechanical interaction, while the areas of reduced height level may have a significantly reduced removal rate due to the substantially missing mechanical contact with the polishing pad and the significantly reduced interaction with the slurry material. For example, the material composition of the cap layer may be selected in an appropriate manner such that a high chemical resistivity with respect to the chemical agent in the slurry material may be achieved. In this manner, a moderately low thickness of the cap layer may provide a high degree of chemical stability while also ensuring an efficient mechanical removal of the cap layer when a substantially identical height level with non-covered areas is reached during the CMP process. Hence, the cap layer may then be efficiently removed so as to also expose a metal material, which may now also be removed in a highly efficient manner upon contact with the chemically reactive slurry material.

In other aspects, a pronounced selectivity of the cap material may not be necessary and a corresponding selectivity in removal rate may be accomplished on the basis of highly non-conformal deposition techniques when forming the cap layer in order to reduce the resulting surface topography on the basis of the non-conformal deposition, thereby also providing enhanced process conditions during the subsequent CMP process. Consequently, by selectively reducing or delaying the chemical interaction with the highly reactive slurry material in areas of reduced height level, a significant improvement of the overall process uniformity of the planarization of metallization layers may be achieved, while not negatively affecting the process time of the CMP process.

Figure 2A:
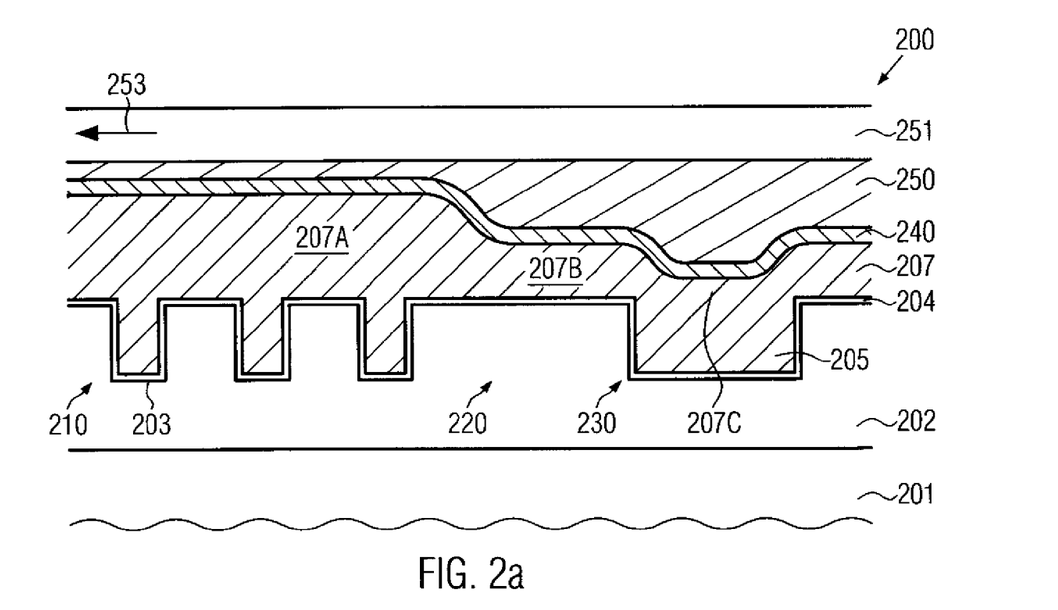
FIGS. 2a-2d schematically illustrate cross-sectional views of a microstructure device including a metallization level during various manufacturing stages in removing excess material and planarizing the surface topography on the basis of a CMP process, in which an exposure to a chemically reactive slurry material during the CMP process may be delayed in device areas of reduced height level according to illustrative embodiments.

FIG. 2a schematically illustrates a microstructure device 200, such as an advanced semiconductor device and the like, which may comprise a substrate 201 that represents any appropriate carrier material for forming thereon and therein respective microstructure features, circuit elements and the like. For example, the substrate 201 may represent any appropriate carrier material having formed thereabove an appropriate semiconductor layer (not shown), which may be configured for forming therein advanced semiconductor devices, such as field effect transistors, capacitors and the like. In some illustrative embodiments, the substrate 201 may have formed therein circuit elements having critical dimensions, i.e., minimum lateral dimensions, of approximately 50 nm and even less, for instance when a gate length of respective field effect transistors is considered. Above the substrate 201 and the respective microstructure features and circuit element there is formed a dielectric layer 202, which may be comprised of any appropriate material demanded by device requirements. It should be appreciated that the dielectric layer 202 may be comprised of different materials and layers, depending on the function of the layer 202 within the device 200. For instance, the dielectric layer 202 may be comprised of well-established conventional dielectrics, such as silicon dioxide, silicon nitride, silicon oxynitride and the like, while, in more sophisticated applications, the dielectric layer 202 may comprise, in addition or alternatively to the former dielectric materials, a low-k dielectric material, at least partially, wherein appropriate etch stop layers, cap layers and the like may be incorporated in accordance with process and device requirements.

The dielectric layer 202 may comprise different device areas 210, 220 and 230, which may differ in geometrical configuration, for instance with respect to the number and size of any openings formed therein. For instance, in the embodiment shown, the first area 210 may comprise a plurality of trenches 203 which may be provided as densely spaced components having a width of several hundred nanometers and significantly less, such as 200 nm and less, while the spacing between neighboring trenches 203 may be of a similar order of magnitude. On the other hand, the area 230 may comprise an opening 205, for instance in the form of a trench or any other feature, wherein the respective lateral dimensions, at least in one dimension, may be significantly greater compared to the lateral dimensions of the trenches 203. For instance, the opening 205 may represent a wide trench. Furthermore, the area 220 may represent a region of a substantially planar surface configuration. It should be appreciated that the areas 210, 220 and 230 are shown so as to illustrate respective surface configurations of the dielectric layer 202 across the substrate 201 in order to demonstrate a significant difference in pattern density, size and shape of respective openings and the like as are typically encountered in advanced metallization structures of semiconductor devices.

At this manufacturing stage, the trenches 203 and the opening 205 may be filled with an appropriate metal-containing material, such as copper, copper alloy, silver and the like, as may be demanded by device requirements. The corresponding metal-containing material may be provided in the form of a metal layer 207 that may comprise respective portions of excess material having different height levels depending on, for instance, the surface topography of the dielectric layer 202, the respective process parameters of a deposition process for forming the metal layer 207 as previously explained, and the like. For example, in the embodiment shown, a first excess portion 207A may be located above the area 210, while respective excess portions 207B and 207C may be located above the areas 220, 230, respectively, wherein a height level of the portion 207B may be less compared to the portion 207A and the height level of the portion 207C may be less than the height level of the portion 207B. Furthermore, the respective material of the layer 207 may be separated from the dielectric material of the layer 202 by an appropriate barrier material 204, which may be comprised of any appropriate material, such as tantalum, tantalum nitride, titanium, titanium nitride, appropriate metal alloys, such as tungsten-containing compounds, and the like.

Furthermore, at this manufacturing stage, the device 200 may comprise a cap layer 240, which may be comprised of any appropriate material that may exhibit a moderately high chemical resistivity with respect to a slurry material 250 to be used during a chemical mechanical polishing process, indicated as 253, for planarizing the surface topography of the device 200 as previously explained. For instance, the cap layer 240 may be formed as a substantially conformal layer so as to resemble the surface topography of the metal layer 207. For example, a plurality of polymer materials may be used for the cap layer 240, thereby endowing the cap layer 240 with a high chemical resistivity with respect to the slurry material 250 while nevertheless providing enhanced mechanical removal efficiency upon contact with a polishing pad 251 during the subsequent CMP process 253. Thus, the cap layer 240 may have a high chemical resistance while nevertheless provide similar mechanical characteristics compared to the metal layer 207 upon contact with the polishing pad 251. In other illustrative embodiments, the cap layer 240 may represent any other appropriate material, such as dielectric materials, conductive materials and the like, which may have a significantly different etch behavior with respect to the slurry material 250 compared to the metal in the layer 207.

It should be appreciated that appropriate material compositions for the cap layer 240 may be readily determined once the composition of the slurry material 250 is selected so that a respective flexibility in providing appropriate slurry materials 250 and materials for the cap layer 240 may be achieved. Depending on the chemical and mechanical characteristics of the cap layer 240, the thickness thereof may be adjusted to obtain the desired degree of blocking or reducing the interaction of the slurry material 250 with the material of the layer 207 in the areas 220 and 230 having the reduced height level. For instance, polymer materials having a high chemical resistivity with respect to the slurry material 250 may be provided with a thickness of approximately 10-100 nm and even more, wherein the mechanical characteristics of the cap layer 240, i.e., the removal rate upon a mechanical contact with the polishing pad 251 may, for instance, be adjusted on the basis of an appropriate post-deposition treatment of the polymer material, such as curing and the like. Thus, the hardness of the cap layer 240 may be appropriately adjusted so as to not unduly affect the overall removal rate upon contact with the polishing pad 251.

The device 200 as shown in FIG. 2a may be formed on the basis of the following process. After manufacturing respective microstructure features and circuit elements in and above the substrate 201 on the basis of well-established process techniques, the dielectric layer 202 may be formed on the basis of deposition techniques, spin on processes and the like, depending on the material composition of the dielectric layer 202. In some illustrative embodiments, the dielectric layer 202 may be formed on the basis of low-k dielectric materials having a reduced mechanical stability compared to conventional dielectrics, such as silicon dioxide, silicon nitride and the like, thereby requiring advanced planarization techniques on the basis of chemically reactive slurry materials, such as the slurry 250. After forming the dielectric material of the layer 202, appropriate patterning techniques may be performed in order to obtain the desired surface topography in the layer 202, i.e., forming the trenches 203 and the opening 205 in the respective areas 210, 220 and 230. For instance, advanced photolithography techniques in combination with anisotropic etch processes may be used for forming the trenches 203 and the opening 205. Thereafter, the barrier material 204, if required, may be formed at least within the trenches 203 and the opening 205 on the basis of any appropriate deposition technique including CVD, ALD, electrochemical deposition processes and the like. It should be appreciated that the patterning of the dielectric layer 202 may include the formation of respective vias (not shown), which may provide an electrical connection of one or more of the trenches 203 and the region 205 to any other conductive areas, such as contact portions of circuit elements, metal lines and regions of other lower lying metallization levels and the like. Thus, in some approaches, the respective via openings have to be coated with the barrier material 204 along with the trenches 203, 205, thereby requiring highly sophisticated deposition techniques. Similarly, during the subsequent filling in of material of the layer 207, enhanced deposition strategies in the respective electrochemical processes may have to be applied when high aspect ratio vias have to be filled commonly with the trenches 203, 205. During the respective deposition process, the locally different deposition conditions as well as the respective process parameters may result in the pronounced surface topography as represented by the respective excess portions 207A, 207B and 207C. Next, the cap layer 240 may be formed, for instance on the basis of highly conformal deposition techniques, such as CVD, using an appropriate precursor material, wherein appropriate deposition recipes are available in the art with respect to a plurality of polymer materials, dielectric materials, such as silicon-based materials, and the like. For example, silicon-based dielectric materials may be deposited with a very low thickness due to their chemical stability with respect to a plurality of slurry materials 250 having the high chemical efficiency with respect to removing the material of the layer 207. In this case, even extremely thin layers of 10 nm and even less may be appropriate for efficiently delaying the exposure of the excess portions 207B, 207C, while not unduly reducing the overall mechanical removal rate upon contact with the polishing pad 251. In other illustrative embodiments, appropriate physical vapor deposition techniques may be used, wherein a plurality of well-established recipes are available. For example, the cap layer 240 may comprise a metal, such as tantalum, titanium, tungsten and the like, which may be efficiently applied by physical vapor deposition, such as sputter deposition.

In still other illustrative embodiments, the cap layer 240 may be formed on the basis of electrochemical deposition techniques, such as electroplating or electroless plating, wherein an appropriate material composition may be deposited. In this case, the previously formed layer 207 may be advantageously used as a current distribution layer or an activation layer, if an electroless deposition process is considered. For example, after the electrochemical deposition of the layer 207, the device 200 may be processed in a subsequent process chamber on the basis of an appropriate electrolyte solution for forming the desired material of the layer 240.

In this case, an efficient overall process flow may be established, since the respective deposition process may be efficiently performed in an appropriately designed cluster tool.

In other illustrative embodiments, the cap layer 240 may be formed on the basis of a surface treatment of the layer 207. For this purpose, the layer 207 may be exposed to an appropriate reactive ambient in order to modify the respective surface portions thereof. In one illustrative embodiment, a reactive gaseous ambient may be established to initiate a surface reaction with the material 207, thereby forming the cap layer 240. For example, the reactive gaseous ambient may include an oxidizing ambient, thereby forming a respective metal oxide material in the surface portion of the layer 207, which may have, depending on the characteristics of the slurry 250, a significantly enhanced chemical stability with respect to the slurry material 250 compared to the material of the metal layer 207. In other illustrative embodiments, the gaseous ambient may result in a different chemical reaction, such as a silicidation, nitridation and the like, thereby providing significantly different chemical characteristics of the modified surface portion, which may now act as the cap layer 240. In other illustrative embodiments, the gaseous ambient may be established on the basis of a plasma ambient in order to promote or initiate an appropriate chemical reaction with exposed surface portions of the metal layer 207. Consequently, by using an appropriate plasma ambient, any appropriate species may be incorporated into the surface of the layer 207 to modify the surface characteristics and/or initiate a chemical reaction, thereby forming the cap layer 240. In still other illustrative embodiments, a respective surface modification may be obtained on the basis of a low energy implantation process in order to incorporate any appropriate species, such as nitrogen, silicon, aluminum and the like, depending on the characteristics of the slurry 250 and the chemical "inertness" of the finally obtained modified surface portion of the layer 207. Since respective plasma ambients and implantation processes may be established for a plurality of atomic and molecular species, the respective surface characteristics of the modified material of the layer 207, i.e., the cap layer 240, may be adapted to the specific chemical behavior of the slurry material 250 with high flexibility.

In still other illustrative embodiments, the surface modification of the layer 207 may be performed on the basis of a wet chemical ambient which may be established on the basis of appropriate reagents for appropriately modifying the material of the layer 207. For example, if an oxide of the material of the layer 207 has been identified to have a sufficient chemical resistivity with respect to the slurry 250, a corresponding wet chemical oxidation process may be performed in order to obtain the cap layer 240. For copper-based materials, a plurality of wet chemical mixtures are well known that may significantly modify the chemical behavior of the copper-based material after the wet chemical process. In still other illustrative embodiments, a corresponding wet chemical mixture or compound may be applied in an initial phase of a corresponding CMP process performed on the basis of the polishing pad 251, wherein, prior to supplying the slurry material 250, a corresponding chemical component may be supplied. Thus, in this case, the supply of the corresponding wet chemical component may result in an efficient conversion of material of the layer 207 into a highly chemically inert portion of the layer 240 in the device areas 220 and 230, in which an immediate mechanical contact with the polishing pad 251 may be substantially avoided or at least be significantly reduced due to the different height level. On the other hand, a pronounced formation of the material of the layer 240 on the excess portion 207A may be avoided due to the continuous mechanical removal caused by the immediate contact with the polishing pad 251. After a certain time period, the respective wet chemical component may be removed, for instance by rinsing substrate 200, and thereafter the slurry 250 may be supplied so as to actually start the chemical mechanical polishing with high removal rate in the area 210, while the portions 207B, 207C may be efficiently covered by the cap layer 240. Thus, in this case, the cap layer 240 may be formed in a highly selective manner during the CMP process, thereby providing a highly efficient process sequence, wherein even a thickness of the layer 240 above the portion 207A may be reduced in situ forming the layer 240 due to the immediate mechanical contact with the polishing pad 251. In other cases, the cap layer 240 may be formed by a wet chemical process without a mechanical contact with the polishing pad 251 at any appropriate stage prior to the CMP process 253.

After the formation of the cap layer 240, the CMP process may be performed on the basis of the polishing pad 251 and the slurry 250, which may have incorporated therein a chemically reactive component for enhancing the removal of the material 207 upon direct contact with the slurry material 250. Hence, after exposing the portion 207A, due to the direct contact with the polishing pad 251, a desired high removal rate may be obtained in the portion 207A, while the portions 207B and 207C may be chemically protected by the layer 240, and wherein a respective mechanical contact with the polishing pad 251 may be significantly reduced due to the pronounced surface topography.

Figure 2B:
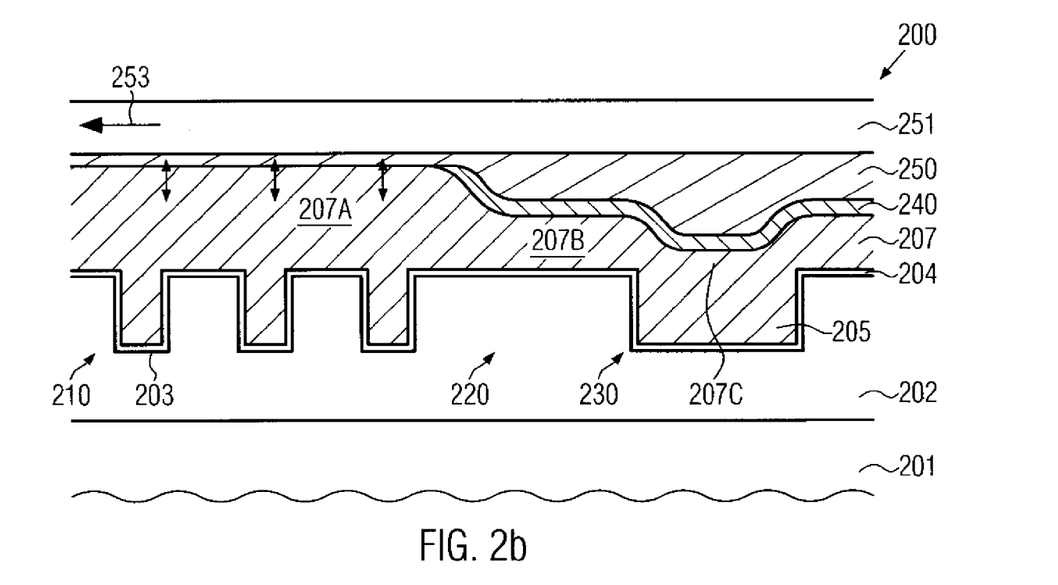

FIG. 2b schematically illustrates the device 200 in a further advanced stage of the CMP process 253. As shown, the slurry 250 may chemically interact with the material of the layer 207, while the mechanical action of the polishing pad 251 may further increase the respective removal rate, thereby preferably removing material from the portion 207A, while substantially maintaining the portions 207B, 207C, which may still be covered by a significant portion of the cap layer 240.

Figure 2C:
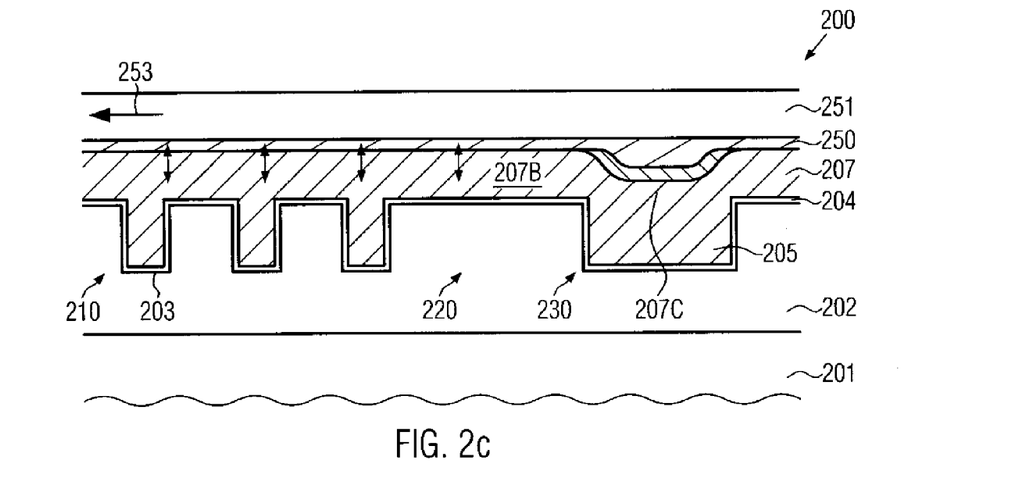

FIG. 2c schematically illustrates the device 200 in a further advanced stage of the CMP process 253, wherein the cap layer 240 in the device area 220 may have been removed by mechanical interaction with the polishing pad 251, thereby exposing the material 207, which may now also interact with the slurry material 250, thereby providing the enhanced removal rate in the area 220, when a substantially similar height level compared to the area 210 is reached. Thus, during the advance of the CMP process 253, a high removal rate and similar height levels may be obtained in the areas 210, 220, while the material of the layer 207 in the area 230 may still be covered by a portion of the cap layer 240.

Figure 2D:
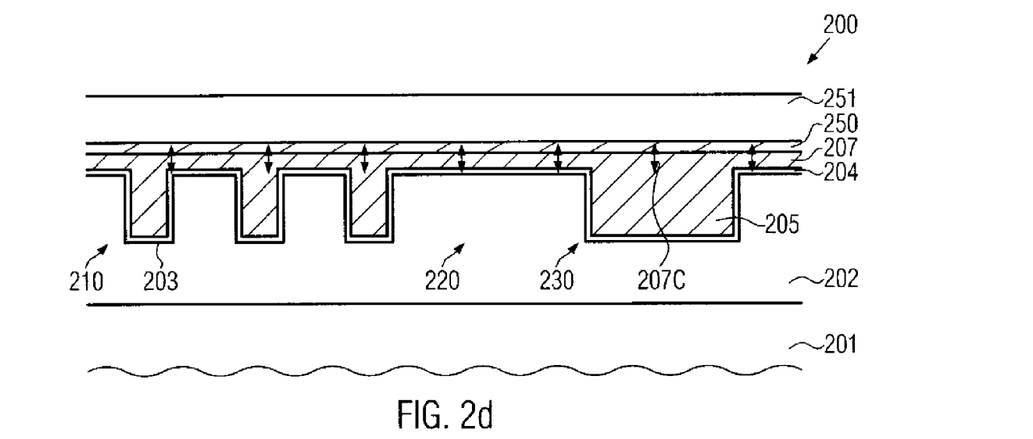

FIG. 2d schematically illustrates the device 200 in a further advanced stage of the CMP process 253, wherein the remaining material of the cap layer 240 above the area 230 may have been removed by a substantially mechanical interaction with the polishing pad 251, thereby also exposing the material 207 in this area to the chemically reactive slurry 250. Hence, substantially similar process conditions as well as similar height levels may be encountered in the areas 210, 220 and 230 at a very advanced stage of the CMP process 253, which may now progress in a highly uniform manner. Consequently, the excess material of the layer 207 may be efficiently removed from the respective device portions, irrespective of the initially provided pronounced surface topography, wherein even the barrier material 204 may be removed with enhanced uniformity while substantially avoiding an undue material erosion in the area 230. Thus, the performance of the metallization level of the device 200 may be increased, due to a reduced CMP induced process variation and, thus, the reliability thereof may be increased. Consequently, a highly efficient CMP process may be performed on the basis of chemically reacting slurry materials, thereby ensuring high removal rates without undue mechanical stress, wherein the dependency on the initial surface topography after the deposition of the metal layer 207 may be significantly reduced.

Figure 2E:
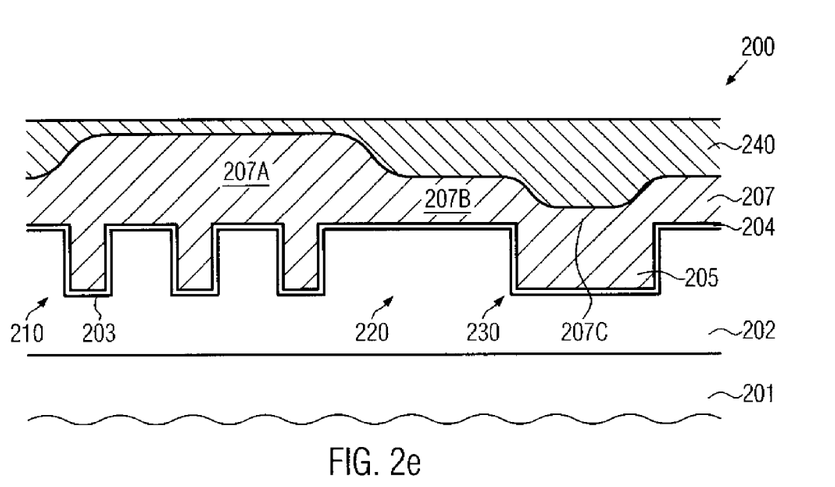
FIG. 2e schematically illustrates a cross-sectional view of a metallization level of a semiconductor device including a non-conformal cap layer according to still further illustrative embodiments.

FIG. 2e schematically illustrates the device 200 according to further illustrative embodiments. Here, the initial pronounced surface topography of the metal layer 207 may be significantly reduced or compensated for by providing the cap layer 240 in a highly non-conformal manner. For example, the cap layer 240 may be provided in the form of an appropriate polymer material, such as photoresist material and the like, which may be deposited on the basis of non-conformal deposition techniques, such as spin-on methods and the like. In other cases, any other appropriate non-conformal deposition processes may be used. Due to the significant reduction of the surface topography prior to the CMP process 253, a high degree of flexibility in selecting appropriate materials for the layer 240 may be provided. For instance, in some cases, a pronounced chemical resistivity of the layer 240 with respect to the slurry material 250 may not be required, as long as the mechanical characteristics of the material of the layer 240 may result in a similar removal rate compared to exposed portions of the metal layer 207. For instance, the material characteristics of the cap layer 240 may be selected such that the material is sufficiently softer compared to the metal of the layer 207, thereby ensuring an efficient removal upon a mechanical contact with the polishing pad 251. In other cases, the chemical and mechanical removal characteristics of the material of the layer 240 may be similar to the metal 207, thereby providing a uniform overall removal rate.

As a result, the subject matter disclosed herein provides an enhanced technique for planarizing metallization levels of sophisticated microstructure devices on the basis of a process sequence including a CMP process, wherein height levels of the initially pronounced surface topography may be leveled in a more efficient manner, in particular, when slurry materials with a highly reactive chemical component are used, by selectively delaying the contact of the slurry material with device portions having a reduced height level. This may be accomplished on the basis of a cap layer, which may have, in some illustrative embodiments, a high chemical resistivity with respect to the slurry material, while, in other aspects, a substantial reduction of the initial surface topography may be accomplished on the basis of the cap layer when provided in a highly non-conformal manner. Consequently, the overall process uniformity during the planarization process may be enhanced, thereby also reducing performance loss and reliability variations of respective metal lines.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a metal layer comprising excess material that is positioned above an upper surface of a patterned dielectric layer formed above a substrate, said patterned dielectric layer comprising a first region and a second region;

forming a cap layer on said metal layer; and completely removing said cap layer and removing a first portion of said excess material of said metal layer by chemical mechanical polishing, wherein a second portion of said excess material remains above an upper surface of said second region of said patterned dielectric layer after completely removing said cap layer.

2. The method of claim 1, wherein said cap layer has a higher chemical resistivity against a slurry used in said chemical mechanical polishing relative to said metal layer.

3. The method of claim 1, wherein forming said cap layer comprises forming said cap layer as a conformal layer.

4. The method of claim 1, wherein said cap layer is formed by chemical vapor deposition.

5. The method of claim 1, wherein said cap layer is formed by an electrochemical deposition process.

6. The method of claim 1, wherein said cap layer is formed in an initial phase of said chemical mechanical polishing process.

7. The method of claim 1, wherein said cap layer is formed by physical vapor deposition.

8. The method of claim 1, wherein said excess material of said metal layer comprises a first part having a first excess height above an upper surface of said first region and a second part having a second excess height less than said first excess height above said upper surface of said second region.

9. The method of claim 1, wherein said cap layer is formed by a non-conformal deposition process.

10. The method of claim 9, wherein said cap layer has a similar removal rate compared to said metal layer during said chemical mechanical polishing process.

11. The method of claim 1, wherein said cap layer is formed by treating an exposed surface of said metal layer.

12. The method of claim 11, wherein treating said exposed surface comprises a reactive wet chemical process.

13. The method of claim 11, wherein treating said exposed surface comprises exposing said surface to a reactive gas ambient to chemically modify material of said metal layer.

14. The method of claim 13, wherein said reactive gas ambient is established on the basis of a plasma ambient.

15. A method of planarizing a metal-containing layer of a semiconductor device, the method comprising:

selectively exposing metal material of a first region of said metal-containing layer formed above an upper surface of a dielectric layer of said semiconductor device to a slurry during a chemical mechanical polishing process, while covering a second region of said metal-containing layer formed above said upper surface of said dielectric layer, said first region having a first height level above said upper surface of said dielectric layer and said second region having a second height level above said upper surface of said dielectric layer, said first height level being greater than said second height level, wherein covering said second region comprises forming a cap layer at least above said second region;

completely removing said cap layer during said chemical mechanical polishing process; and removing at least a first portion of said first and second regions of said metal-containing layer, wherein at least a second portion of said second region remains above said upper surface of said dielectric layer after completely removing said cap layer, said second portion having a third height level above said upper surface of said dielectric layer that is substantially equal to or less than said second height level.

16. The method of claim 15, wherein said cap layer is formed in a non-conformal manner.

17. The method of claim 15, wherein said second portion of said second region of said metal-containing layer has a height level above said upper surface of said dielectric layer that is less than said second height level after removing said first portion of said second region.

18. The method of claim 15, wherein said cap layer is formed on said first and second regions in a substantially conformal manner.

19. The method of claim 18, wherein a chemical resistivity of said cap layer when exposed to said slurry is higher than a chemical resistivity of said metal material.

20. A method, comprising:

forming a metal-containing material above first and second regions of a dielectric layer of a semiconductor device, said dielectric layer comprising a plurality of openings filled by said metal-containing material, said metal-containing material comprising a first portion of excess material with a first height level above an upper surface of said first region and a second portion of excess material having a second height level above an upper surface of said second region, said first height level being greater than said second height level;

forming a cap layer at least on said second portion of said excess material formed above said second region; and completely removing said cap layer and removing at least an upper part of said first and second portions of excess material by a chemical mechanical polishing process, wherein at least a remaining part of said second portion remains above said upper surface of said second region after completely removing said cap layer.

21. The method of claim 20, wherein said cap layer is conformally formed on said first and second portions as a material having a higher chemical resistivity against a slurry used in said chemical mechanical polishing process.

22. The method of claim 20, wherein said cap layer is formed by a non-conformal deposition process.

* * * * *